(12) United States Patent
Mizuno et al.

(10) Patent No.: US 6,284,020 B1
(45) Date of Patent: Sep. 4, 2001

(54) METHOD OF MAINTAINING CLEANLINESS OF SUBSTRATES AND BOX FOR ACCOMMODATING SUBSTRATES

(75) Inventors: Ayako Mizuno; Makiko Katano; Katsuya Okumura, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/555,501

(22) PCT Filed: Dec. 2, 1998

(86) PCT No.: PCT/JP98/05422

§ 371 Date: Jun. 2, 2000

§ 102(e) Date: Jun. 2, 2000

(87) PCT Pub. No.: WO99/28968

PCT Pub. Date: Jun. 10, 1999

(30) Foreign Application Priority Data

Dec. 2, 1997 (JP) .................................................. 9-347226

(51) Int. Cl.$^7$ .................................................. B01D 50/00
(52) U.S. Cl. .................. 95/26; 55/385.2; 55/356; 55/467; 55/385.1; 96/424; 96/115; 95/90; 95/273
(58) Field of Search ........................ 55/385.1, 385.2, 55/385.4, 385.6, 467, 471, 473, 356, 357, 529; 95/26, 900, 108, 424; 206/710; 454/192, 229; 96/115, 116

(56) References Cited

U.S. PATENT DOCUMENTS

| | | | |
|---|---|---|---|
| 4,037,830 | * 7/1977 | Poluzzi et al. | 55/385.2 |
| 4,202,676 | * 5/1980 | Pelosi, Jr. et al. | 55/385.2 |
| 4,666,479 | * 5/1987 | Shoji | 55/385.4 |
| 4,668,484 | * 5/1987 | Elliott | 55/385.1 |
| 4,724,874 | * 2/1988 | Parikh et al. | 55/385.1 |
| 4,770,680 | * 9/1988 | Machida et al. | 55/385.1 |
| 4,963,069 | * 10/1990 | Wurst et al. | 55/385.1 |
| 5,827,118 | * 10/1998 | Johnson et al. | 55/385.2 |
| 5,833,726 | * 11/1998 | Kinkead et al. | 55/385.1 |
| 5,843,196 | * 12/1998 | Leavey et al. | 55/356 |

FOREIGN PATENT DOCUMENTS

| | | |
|---|---|---|
| 4-104811 | 4/1992 | (JP) . |
| 6-015165 | 4/1994 | (JP) . |
| 07-283092 | 10/1995 | (JP) . |
| 8-088155 | 4/1996 | (JP) . |
| 8-148551 | 6/1996 | (JP) . |
| 8-314152 | 11/1996 | (JP) . |
| 10-214883 | 8/1998 | (JP) . |

* cited by examiner

*Primary Examiner*—Duane Smith
*Assistant Examiner*—Jason M. Greene
(74) *Attorney, Agent, or Firm*—Oblon, Spivak, McClelland, Maier & Neustadt, P.C.

(57) ABSTRACT

A method of maintaining cleanliness of substrates including a first step for accommodating at least a piece of substrate having a gaseous impurity-trapping filter arranged close thereto in a hermetically sealed box, and a second step for circulating the atmosphere in the box at a rate of two or more times a minute so that impurities in the atmosphere are adsorbed by the gaseous impurity-trapping filter. A box for accommodating substrates includes a housing in which space for accommodating the substrates is hermetically closed with a lid, a gaseous impurity-trapping filter arranged in the housing and adapted to adsorb impurities contained in the atmosphere in space, and an atmosphere-circulating device having a ratio of the circulating capacity to the space volume of not smaller than 2 in order to circulate the atmosphere so as to pass it through the gaseous impurity-trapping filter.

16 Claims, 9 Drawing Sheets

METHOD OF MAINTAINING CLEANLINESS OF SUBSTRATES AND BOX FOR ACCOMMODATING SUBSTRATES

BACKGROUND OF THE INVENTION

1. Field of the Invention

The present invention relates to a method for removing detrimental chemical impurities adhered to substrates to maintain necessary high cleanliness, and to a box for accommodating the substrates to store and transfer. The substrates include ones such as semiconductor wafers that are between processing machines in manufacturing semiconductor devices, substrates on which LCD pattern is formed, substrates for photo-masking, and magnetic discs.

2. Discussion of the Background

As semiconductor devices become finer- and denser-packed, processing becomes more complicated. As a result, adverse affects of contamination due to gaseous impurities generated in the process become conspicuous. For instance, in the dry etching process or the CVD (Chemical Vapor Deposition) process for metallic wiring, acid gases of high vapor pressure such as chlorine (Cl) and fluorine (F) compounds remain on semiconductor wafers to corrode the metallic wiring on the semiconductor wafers. Further, in the deep-UV lithography processes, basic gases such as ammonia or the like in the atmosphere or adsorbed by the semiconductor wafers cause an abnormality of pattern in machining the resist. These adverse influences due to the gaseous impurities on process performance cause problems.

In the existing manufacturing method of semiconductor devices, to secure and maintain cleanliness of the atmosphere in a clean room in which the semiconductor wafers are processed, a gaseous impurity-trapping filter such as a chemical filter or activated carbon filter is provided to an air conditioner to trap and remove efficiently these detrimental gaseous impurities. By employing such a method, the detrimental gaseous impurities in the process are prevented from causing contamination.

However, when transferring semiconductor wafers from one processing machine to another processing machine or from one room to another room in a clean room, and from one machine to another machine laid between clean rooms, as a clean space isolated from the space inside or outside the clean room, hermetically sealed boxes are in use. Accordingly, when transferring wafers from one process to another process, in the hermetically sealed box, due to out gases from the wafers, concentrations of these gaseous impurities become high. As a result, these gaseous impurities brought in by the wafers themselves contaminate the clean room.

Japanese Patent Application No. HEI 6-87964 discloses a method for cleanly isolating semiconductor wafers from contaminated space outside a clean room. In the method, semiconductor wafers are accommodated in a box of which atmosphere is the same with that of the clean room, and the box is transferred from a clean room to another clean room.

In the box constituted for the inside thereof to communicate with the outside atmosphere, a particle-trapping HEPA (High Efficiency Particle Air) filter or ULPA (Ultra Low Penetration Air) filter and a gaseous impurity-trapping chemical filter are disposed. In the box, semiconductor wafers and substrates for LCD, which are objects to be processed, are accommodated and transferred. However, in this method, the chemical filter filters the atmosphere always containing impurities to supply into the box. Accordingly, there is a problem that the chemical filter has very short life.

Further, Japanese Patent Laid-open Publication (KOKAI) No. HEI 8-148551 discloses a hermetically sealed case for accommodating substrates that is provided with filters that trap gaseous impurities at a gas inlet and outlet where the atmospheric gas goes in and out. However, the flow rate of the gas in the atmosphere, being restricted to approximately 1 l/min, is impractical. For instance, when a volume of 23 l of a box for 8-inch wafer is replaced by the atmospheric gas to trap impurities, under such a flow rate, more than 20 min is required. Accordingly, impurities that are brought in the box from the external atmosphere during opening/closing to insert the wafers are adhered to the wafers. The impurity gas, being a base such as ammonia, is adsorbed by resist on the surface of the wafer to react to the resist, and being an acid such as sulfur oxide and chlorine, is absorbed by metallic wiring on the surface of the wafer to corrode the metallic wiring.

SUMMARY OF THE INVENTION

The present invention is carried out considering the aforementioned circumstances. An object of the present invention is to provide a method by which in a closed space such as a clean room gaseous impurities brought in by substrates such as semiconductor wafers or the like are efficiently removed to maintain an atmosphere of high cleanliness. Another object of the present invention is to provide a box for accommodating these substrates.

The present invention involves a method that in transferring substrates such as semiconductor wafers from one processing machine to another processing machine in a clean room or laid across between clean rooms and in storing these, can maintain cleanliness of the substrates such as semiconductor wafers. That is, with a box comprising a clean space, the substrates such as the semiconductor wafers are accommodated in the clean space, transferred and stored. The clean space, isolated from the space inside or outside the clean room, involves of circulating air generated by a filter and a ventilating fan.

A method of maintaining cleanliness of a substrate of the present invention comprises a first step of accommodating at least one substrate with a gaseous impurity-trapping filter disposed close thereto in a hermetically sealed box, and a second step of circulating an atmosphere in the box at a rate of two times or more per minute so that impurity in the atmosphere is adsorbed by the gaseous impurity-trapping filter.

According to the present invention, in the second step, the atmosphere in the box is preferably circulated at a rate of from two to five times per minute. In the box, to the substrate, a particles-trapping filter is disposed in the further close vicinity.

An atmosphere circulating apparatus circulates the atmosphere in the box. The atmosphere circulating apparatus is intermittently operated as the need arises.

As the substrate of the present invention, for instance semiconductor substrates or glass substrates for mask process can be cited.

The present method for maintaining cleanliness of the substrates comprises a third step of transferring the box to a prescribed position while maintaining cleanliness of the atmosphere in the box.

The box for accommodating substrates of the present invention comprises a housing in which space for accommodating the substrate is hermetically closed with a lid, and a gaseous impurity-trapping filter disposed in the housing and adsorbing impurity contained in an atmosphere of the space, and an atmosphere circulating apparatus having a circulating capacity to circulate the atmosphere through the gaseous impurity-trapping filter, a ratio of the circulating capacity to the space volume being two or more, preferably from two to five.

In the present invention, the gaseous impurity-trapping filter is formed in pleat, in honeycomb, in sponge, in particle or in plane shape. The present box for accommodating the substrates is provided with a portable power supply. The portable power supply is attached to the outside of the housing.

In the present box for accommodating the substrates, the atmosphere circulating apparatus is intermittently operated.

Inside of the present box for accommodating the substrates comprises a particles-trapping filter between the gaseous impurity-trapping filter and the substrates.

In the present invention, as the substrate, semiconductor substrate and glass substrate for mask processing can be cited.

According to the present invention, in steps requiring high cleanliness such as semiconductor wafer processing steps, the semiconductor wafer or the like can be transferred and stored in the efficiently hermetic-sealed box, in which high cleanliness of the atmosphere is maintained by use of a gaseous impurity-trapping filter for an arbitrary gaseous impurity and by circulating an inner air by a ventilating fan. In addition, due to intermittent operation of the ventilating fan, an uneven distribution of an impurity concentration in the box can be leveled to result in an efficient replacement of the air in the box in a short time.

DESCRIPTION OF THE PREFERRED EMBODIMENTS

One embodiment of the present invention will be explained with reference to FIGS. 1 and 2.

Figure 1:
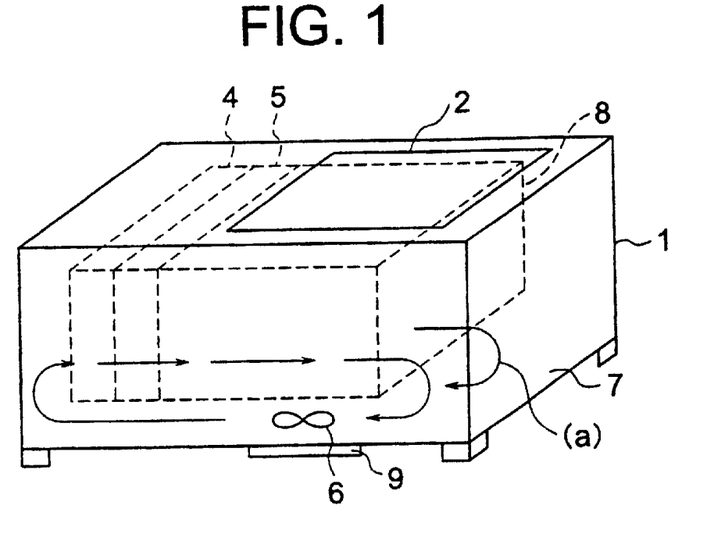
FIG. 1 is a perspective view of a box for accommodating substrates of the present invention.
Figure 2:
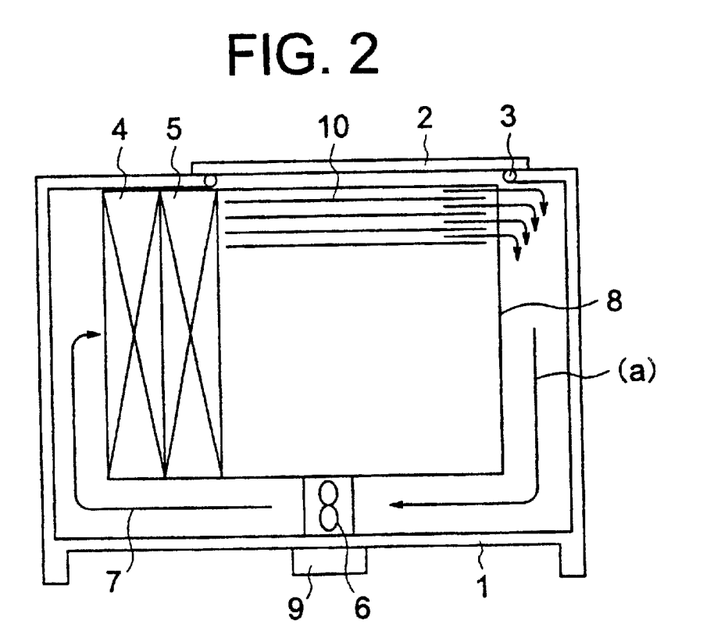
FIG. 2 is a cross section of the box for accommodating substrates of the present invention.

FIG. 1 is a perspective view of a box for accommodating substrates of the present invention, FIG. 2 being a cross section thereof. The hermetic-sealed box comprises a box body 1 and a lid 2. The box body 1 and the lid 2 are hermetically sealed with a sealing member 3 such as an O-ring or the like of less out gas or, without employing the sealing member, by use of a processed shape of an overlapping (opening/closing) portion.

The inside of the box body 1 comprises a gaseous impurity-trapping filter 4, a particle-trapping ULPA or HEPA filter 5, a ventilating fan and a circulation path 7 in which air (a) circulates as shown by arrows.

A wafer-carrier 8 on which wafers 10 are loaded is accommodated in a box, followed by hermetic-sealing. The air in the box body 1 is circulated by the ventilating fan 6 to go through a chemical filter (impurity-trapping filter) 4, the impurity being trapped, and the cleaned air being sent to the semiconductor wafers 10 further through the ULPA filter 5. Thus, the box, while circulating the cleaned air within the box and storing the semiconductor wafers 10 in the cleaned air, is transferred from a prescribed step (machine) to another step. As a power supply 9 for the ventilating fan 6, the box is provided with a battery (secondary battery) (not shown in the figure). Other than during transfer, electricity is supplied from the outside. At the same time, the battery is charged.

The air circulation path 7 has a passage consisting of ventilating fan 6→ gaseous impurity-trapping filter 4→ particles trapping filter 5→ semiconductor wafers 10→ ventilating fan 6, the air flow generated by the ventilating fan 6 being circulated in this passage.

In the present invention, arrangement of the fan and the filters are not restricted to that shown in FIG. 1. The ventilating fan and filters can be disposed anywhere of the box body. Further, number of the fan is not restricted to one but a plurality of fans can be used as the need arises. In FIGS. 1 and 2, the ventilating fan is disposed below the wafer carrier. For instance at least one of the fans, however, can be disposed on a side surface of the wafer carrier. When the fan is disposed on the side surface of the wafer carrier, the filter is preferable to be disposed below the wafer carrier.

However, even in this case, as shown in FIGS. 1 and 2, the gaseous impurity-trapping filter is preferable to dispose upstream and the particles-trapping filter to dispose downstream. That is, it is preferable to trap particles after trapping the gaseous-impurity.

The box shown in FIGS. 1 and 2 is hermetically sealed after taking in the air of a clean room. Impurity gases contained in the inhaled air, for instance such as HF, $NH_3$, HCl, $SO_x$ gas or the like are trapped by the chemical filter 4. Further, particles in the air are trapped by the following HEPA filter or ULPA filter 5. When taking in the air of the clean room, number of particles involved in the air is small. Accordingly, almost all particles can be trapped by the HEPA or ULPA filter 5 disposed in to the clean box. The air from which the impurity gases and particles are removed is introduced into a space where the object to be processed such as semiconductor wafers or glass substrates are stored.

As mentioned above, for the filters of the box for accommodating substrates, the gaseous impurity-trapping filter 4 and the particle-trapping filter 5 are used.

The chemical filter is used for the gaseous impurity-trapping filter 4. For the chemical filter, any one or a combination of an activated carbon filter for trapping organic gases and chemical filters for trapping harmful chemical impurities each such as a basic gas, an acid gas or the like can be used.

An ion exchange filter utilizing ion-exchange non-woven fabrics or woven fabrics or an activated carbon filter utilizing activated carbon fibers obtained by pyrolyzing to activate cellulose fiber, acrylic fiber, lignin fiber is in practical use as gas-trapping filters. An acid or alkali impregnated activated carbon fiber filter or ion exchange fiber filter can efficiently adsorb and trap ions such as ammonia or the like in the air or ionic substances such as hydrofluoric acid or hydrochloric acid contained in mist.

Next, the activated carbon fiber that is used as base material of the chemical filter will be explained.

The activated carbon is removed of un-textured carbon or the like in the process of activation to have lots of fine pores between principal crystals. Due to the fine pores and large specific surface area, the activated carbon possesses a large physical adsorption capacity. Utilizing this property, the activated carbon is in practical use.

For the activated carbon filter, there are particulate activated carbon filters and activated carbon fiber filters, both being able to effectively trap the gaseous organic substances. In particular, the activated carbon fiber filter, in comparison with the particulate activated carbon fiber filter, has finer pores to be resultant larger specific surface area. Accordingly, as the base material for the air filter, dust generation is less to be excellent in machinability.

To obtain the activated carbon fiber, first, for instance rayon, kainol, polyacrylonitrile, petroleum, petroleum pitch or the like as raw material is formed into fibers. The fibrous carbon undergoes gasifying reaction (activation reaction) with water vapor, carbon dioxide or the like under high temperatures of more than 800° C. With an intention to reinforce strength and to prevent the dust generation, binder that does not contribute in adsorption can be added to the activated carbon fibers. The content of the binder or the like is preferable to be scarce from a viewpoint of material.

When the particulate activated carbon and activated carbon fibers are impregnated with chemicals such as an acid or base, a filter capable of trapping basic or acid impurities in the air can be obtained.

For the chemical filter, the ion exchange filter and activated carbon filter can be used alone or together.

Next, the particles trapping filter 5 will be explained. For the particles trapping filter 5, the ULPA filter, HEPA filter or the like can be used.

The HEPA filter is an air filter having a particle trapping efficiency of more than 99.97% for particles of a diameter of 0.3 μm under a rated air flow.

The ULPA filter is developed with an object to obtain the particles-trapping efficiency higher than that of the HEPA filter, having a particle trapping efficiency of more than 99.9995% for particles of a diameter of 0.1 μm. Glass fibers is used for filtering material in the ULPA filter. However, polytetrafluoroethylene (PTFE) that does not contain impurities such as boron (B) or metal and is not corroded by acid, alkali, organic solvent or the like can be used as the filtering material.

For material of the box, material that evolves less out gas, for instance polycarbonate (PC) or polybutylene terephthalate (PBT) can be used.

When accommodating air of which ammonia concentration in the air is 5 ppb in a box for 8-inch wafers, four times of ventilation can reduce the ammonia concentration in the box to less than 1 ppb. In this case, a volume of the box is 23 litters and the flow rate of the air of the fan is 50 l/min, an operation time being approximately two minutes. Further, when the fan is intermittently operated with the ventilation cycle of 30 sec operation—10 sec interruption, three times of ventilation cycles are enough to attain 1 ppb. The total operation time of the fan is 1.5 min. When continuously operating the fan, the air in the box flows in a definite direction. Accordingly, the air stagnated somewhere can not be sufficiently drawn out. The interruption of the operation allows the stagnated air to diffuse out of the trapped places to cause an improvement of a ventilation efficiency. Due to the cut of the operation time, power saving of the battery is accomplished. Further, due to the impurity concentration in the air and selection of the filter material, the impurity trapping efficiency of the present invention differs a little. The air of which ammonia concentration is 10 ppb can be purified to less than 1 ppb after two minutes operation.

Next, with reference to FIGS. 3 to 5, the variation of the impurity concentration in the air in the box used in a method of the present invention will be explained in detail.

Figure 3:
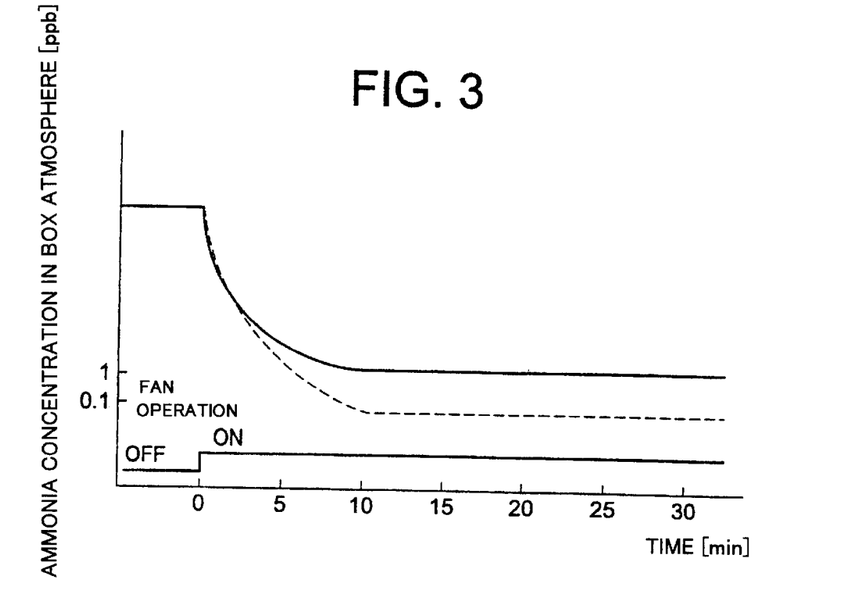
FIG. 3 is a characteristic diagram explaining variation of ammonia concentration with time in the atmosphere in the box of the present invention in comparison with that of an existing example.
Figure 4:
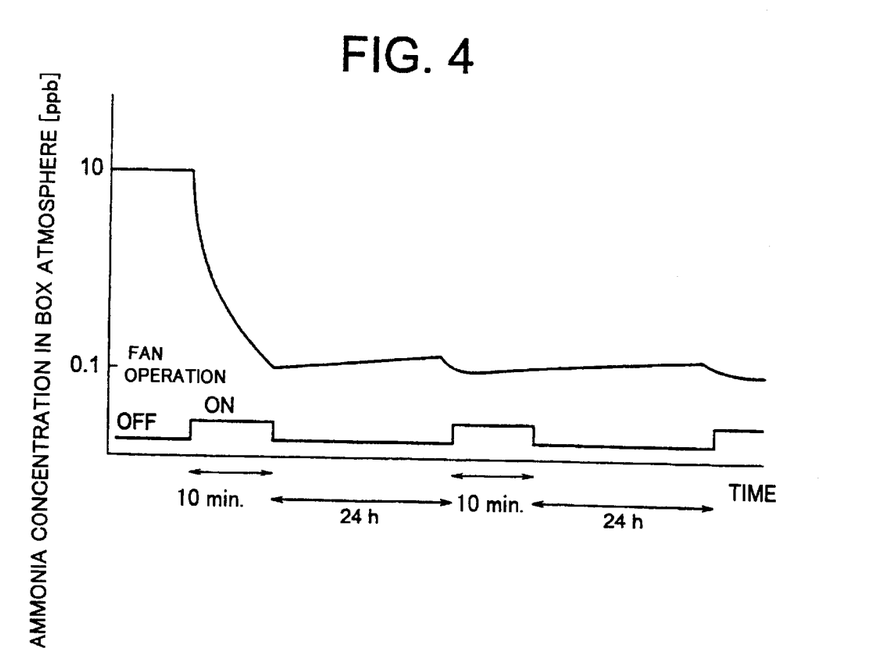
FIG. 4 is a characteristic diagram explaining variation of ammonia concentration with time in the atmosphere in the box of the present invention comparing between intermittent and continuous operations of a ventilating fan.
Figure 5:
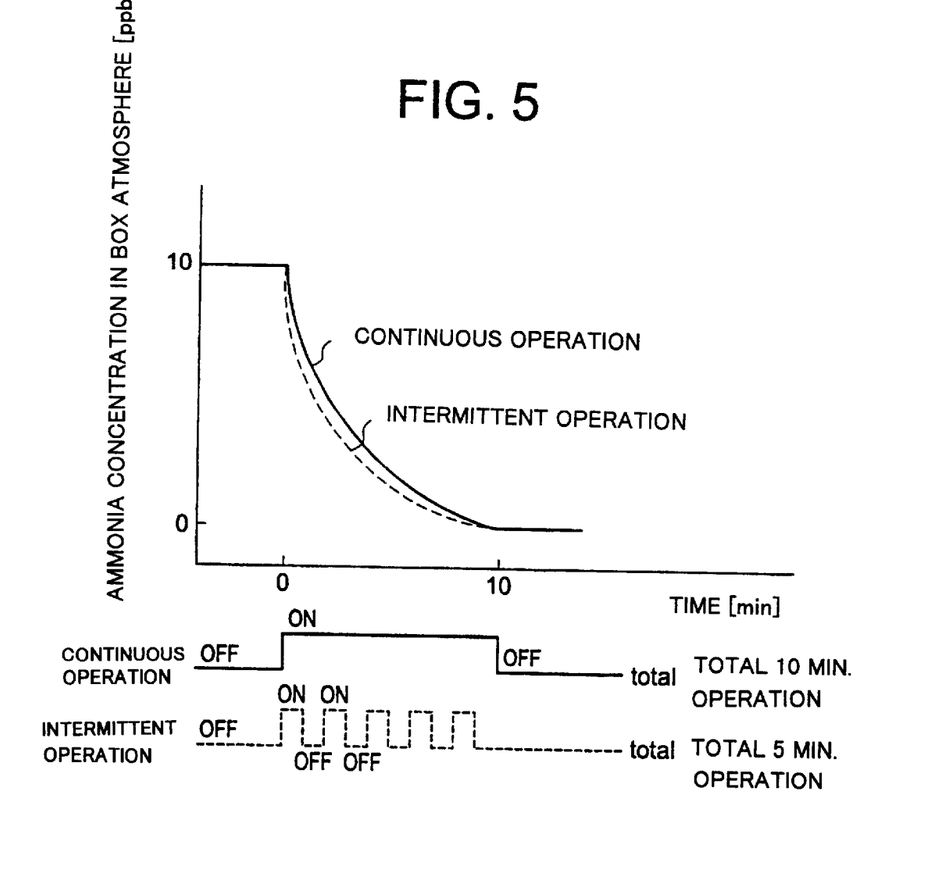
FIG. 5 is a characteristic diagram explaining variation of ammonia concentration with time in the atmosphere in the box of the present invention.

FIGS. 3 to 5 all are characteristic curves showing ammonia concentrations in the box, the vertical axis showing ammonia concentration (ppb), the horizontal axis showing the operating time of the fan (min).

FIG. 3 shows a comparison between the characteristic curves of the present invention and the existing technology (Japanese Patent Application No. HEI 6-87964) that adopts one-pass method involving a clean box of which internal air is not circulated. The fan is operated without interruption. In the one-pass method (existing method), the air that only once passed the chemical filter is introduced into the box and sent to semiconductor wafers by the fan. By contrast, in the method of the present invention, in the hermetically sealed box the internal air is circulated to pass repeatedly the chemical filter. Accordingly, the ammonia concentration in the box is gradually decreased. In the figure, a solid line is a curve for the existing one-pass method, a dotted line showing the present circulation method. Now consider a case where the trapping efficiency of the filter is 90% and an environment (ammonia concentration) is 10 ppb. Whereas the existing one-pass method decreases the ammonia A concentration in the box to 1 ppb, the present method decreases gradually the ammonia concentration from 10 ppb to 1 ppb to 0.1 ppb and so on by repeating the pass of the filter from one to two to three times and so on. Thereby, further lower ammonia concentration in the box can be attained.

FIG. 4 shows a characteristic curve when the fan of the present invention is intermittently operated. As obvious from FIG. 4, in intermittently operating, only 10 min operation a day can maintain the ammonia concentration in the box at less than a definite value without operating the fan for another 24 hours. Though during 24 hours the ammonia concentration in the air in the box increases a little, the next 10 min operation of the fan allows maintaining the ammonia concentration at less than a definite level.

Next, with reference to FIG. 5 the difference of effects of the operations of the fan with and without interruptions will be explained. The continuous operation decreases the ammonia concentration in the air in the box to 0.1 ppb by continuously circulating the air in the box of which ammonia concentration is 10 ppb. On the other hand, the intermittent operation decreases the ammonia concentration to 0.1 ppb by intermittently circulating the air of which ammonia concentration in the air is 10 ppb with repetition of five times of the cycle of 1 minute of operation and 1 minute of interruption. Rather than operating for 10 min without interruption, the operation for 10 min with interruption of 1 min on and 1 min off can obviously reduce the ammonia concentration to the same level faster than the continuous operation while further saving power.

The hermetic-sealing characteristics that the box possesses are defined in the following way. When the ammonia concentration in the external environment is for instance 10 ppb and that in the box is being reduced to 0.1 ppb, if the concentration of at least 0.1 ppb can be maintained for a day with the fan off, the box is said to be in a hermetically sealed state. That is, the hermetically sealing characteristics in the present invention is defined as a state where when the box is left for a day an amount of the air getting out of and into the box is less than 1% of the volume.

Next, the life of the chemical filter used in the present invention is explained compared with that of the aforementioned existing one-pass method.

Calculation is done based on the operation without interruption. When compared the cases of continuously operating without interruption by use of the existing one-pass method and of continuously operating the present box assuming that the box is given twenty times of opening/closing a day, the life of the present chemical filter is approximately two hundred times longer than that of the existing one. Whereas the one-pass method is operated while always taking in the air containing impurity, in the present invention, after opening and closing once, only the air of the volume in the box is necessary to be filtered. Only the impurity contained in a volume corresponding to (number of opening/closing)×(the volume of the box) are accumulated in the filter. When the volume of the box is 20 litters (L) and the fan is operated so that the air in the box is filtered three times per minute, processing amounts of the air per day are as follows;

for one-pass method: 20 L×3 times/min×60 min×24 hours=86400 L for the present method: 20 L×20 times/day=400 L. Accordingly, when the life of the filter in the existing one-pass method is one month, that of the present invention is approximately 200 months.

Now, when a total amount of ammonia that is generated from semiconductor wafers in the box is 10 ng/min, in a state where the fan is off for 10 min, the ammonia concentration in the box becomes 4 ppb. However, due to the aforementioned operation method the ammonia concentration in the box can be always kept under 1 ppb.

Semiconductor wafers treated by buffered hydrofluoric acid (ammonium fluoride+hydrofluoric acid) and chemically sensitized resist coated wafers are simultaneously transferred and stored for a prescribed period of time in the box used in the present method and the existing hermetic-sealed box. Thereafter, when developed, an obvious difference of width of the resist is found between the two cases. When the semiconductors are stored in the box to be used in the present method, ammonia that is the out gas from the semiconductor wafers can be trapped and removed to prevent ammonia from adhering to form a layer difficult to dissolve.

The semiconductor wafers after dry-etching are transferred and stored for a definite period of time in the box to be used in the present method and in the existing hermetic-sealed box to compare. There is an obvious difference in corrosion of wiring between the two cases. When accommodated in the box to be used in the present method, $Cl_2$ gas remaining with the semiconductor wafers is trapped to enable to prevent Al wiring from being corroded due to adsorption of the $Cl_2$ gas.

A slight amount of organic out gases that are generated from constituent members such as the box and sealing material to be used in the present method is trapped by the activated carbon filter in the box. Thereby, the organic can be prevented from adhering to the surfaces of the semiconductor wafers.

The present invention can be employed, other than in semiconductor wafer process, in the mask process and liquid crystal process of glass substrates.

As the chemical filter, other than ion exchange fibers/non-woven fabric, the chemical filter in which an acid or base is impregnated in the activated carbon can be used. As the activated carbon filter, a filter composed of, other than activated carbon fibers, fine particulate activated carbon can be used. When a filter having an absorbent capable of efficiently absorbing moisture is used, humidity can be kept low.

Further, with reference to FIGS. 6 to 9, the shape of the chemical filter being used for the box for accommodating substrates of the present invention will be explained.

Figure 6A:
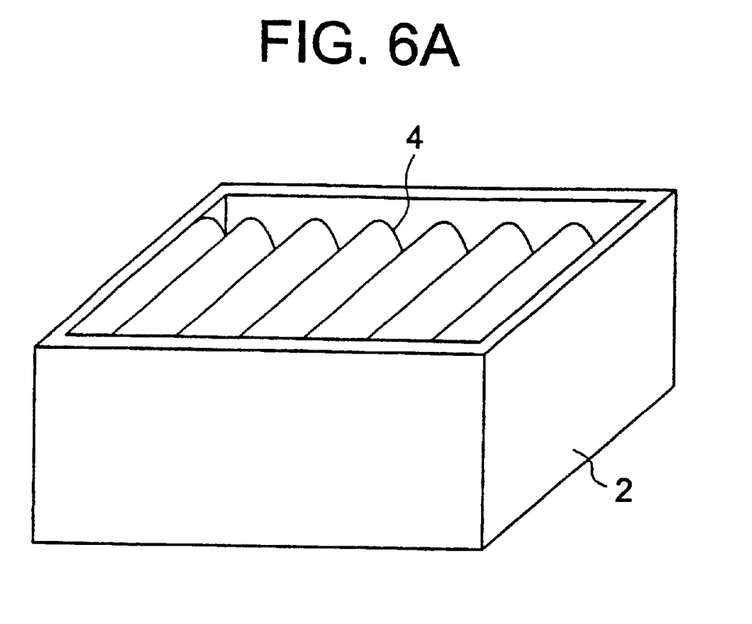
FIG. 6A is a perspective view of a pleat like filter used in the box for accommodating the substrates of the present invention, FIG. 6B being a cross section of the pleat like filter.
Figure 6B:
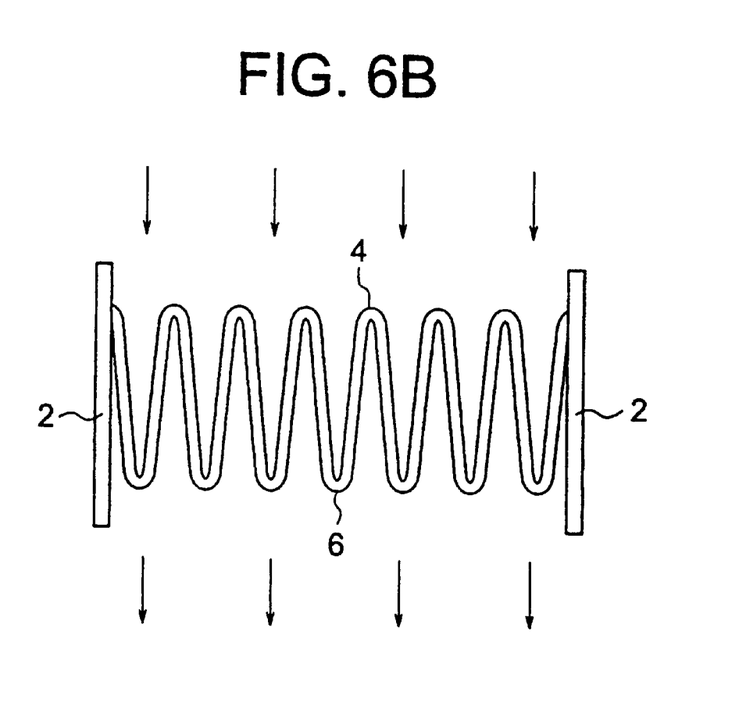
Figure 7:
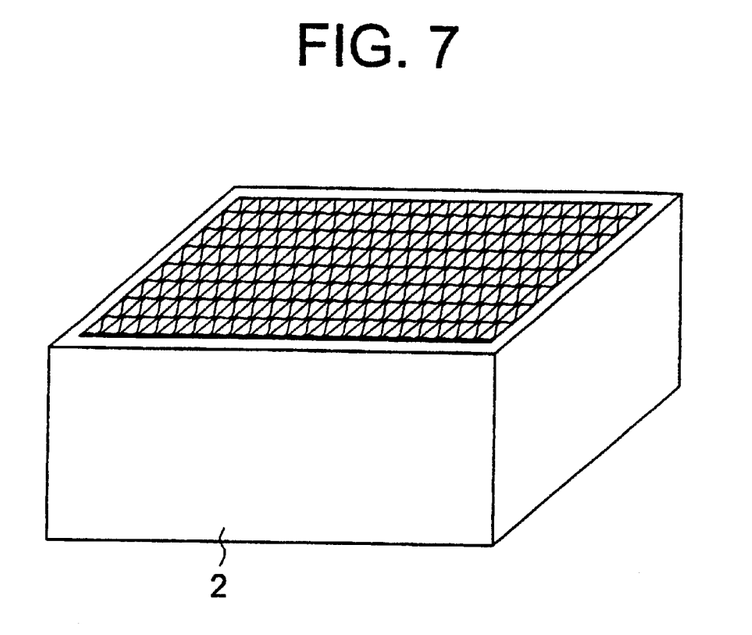
FIG. 7 is a perspective view of a honeycomb filter used in the box for accommodating the substrates of the present invention.
Figure 8:
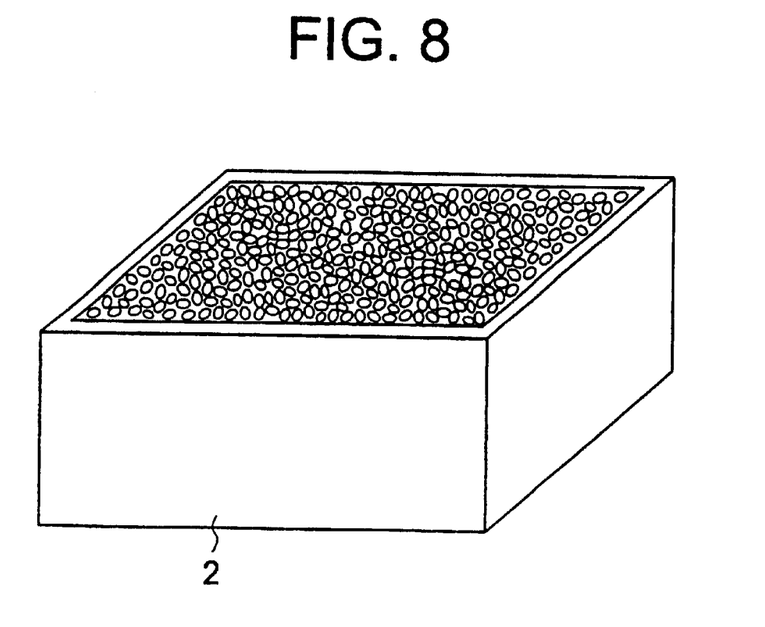
FIG. 8 is a perspective view of a sponge filter used in the box for accommodating the substrates of the present invention.
Figure 9A:
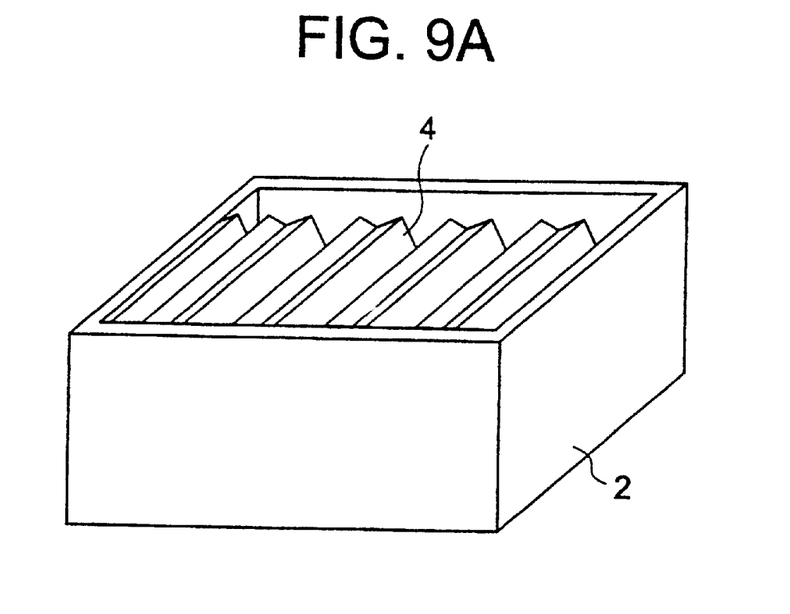
FIG. 9A is a perspective view of a filter of such a type that accommodates particles in a case, FIG. 9B being a cross section thereof.
Figure 9B:
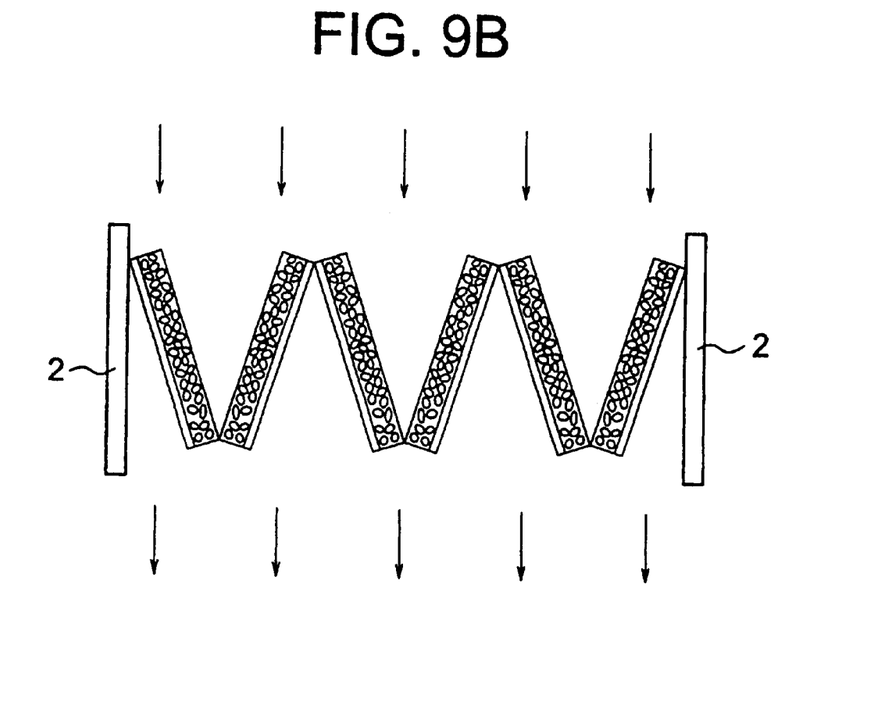

FIG. 6A is a perspective view of a pleat filter, FIG. 6B being a cross section thereof. FIG. 7 is a perspective view of a honeycomb filter, FIG. 8 being a perspective view of a sponge filter. FIG. 9A is a perspective view of a filter that accommodates particles in a case, FIG. 9B being a cross section thereof.

According to the present invention, by forming the filter in a pleat type, a honeycomb type, a sponge type or a type that accommodates particles in a case, a surface area of the filter can be made larger to enable to reduce the pressure loss due to the filter. As a result, a flow rate of the air in the atmosphere can be increased to for instance more than 70 litters/min. When replacing for instance 23 litters of the volume of the box for 8-inch wafers, the air can be circulated three times per minute, that is, number of ventilation being three times per minute. The impurities in the atmosphere can be reduced to one tenth within 1 minute. The number of ventilation is the number with which the atmosphere in the box is circulated in per minute. When the volume of the box is A (litter) and the flow rate is B (litters/min), the number of ventilation X is expressed by B/A.

According to the present invention, thus the time for trapping the impurities in the box can be greatly shortened. When the impurity gas is a base such as ammonia, the resist on the surface of the wafer can be protected from adsorption. When the impurity gas is acid such as sulfur oxide and chlorine, metallic wiring on the surface of the wafer can be protected from being corroded.

Figure 10:
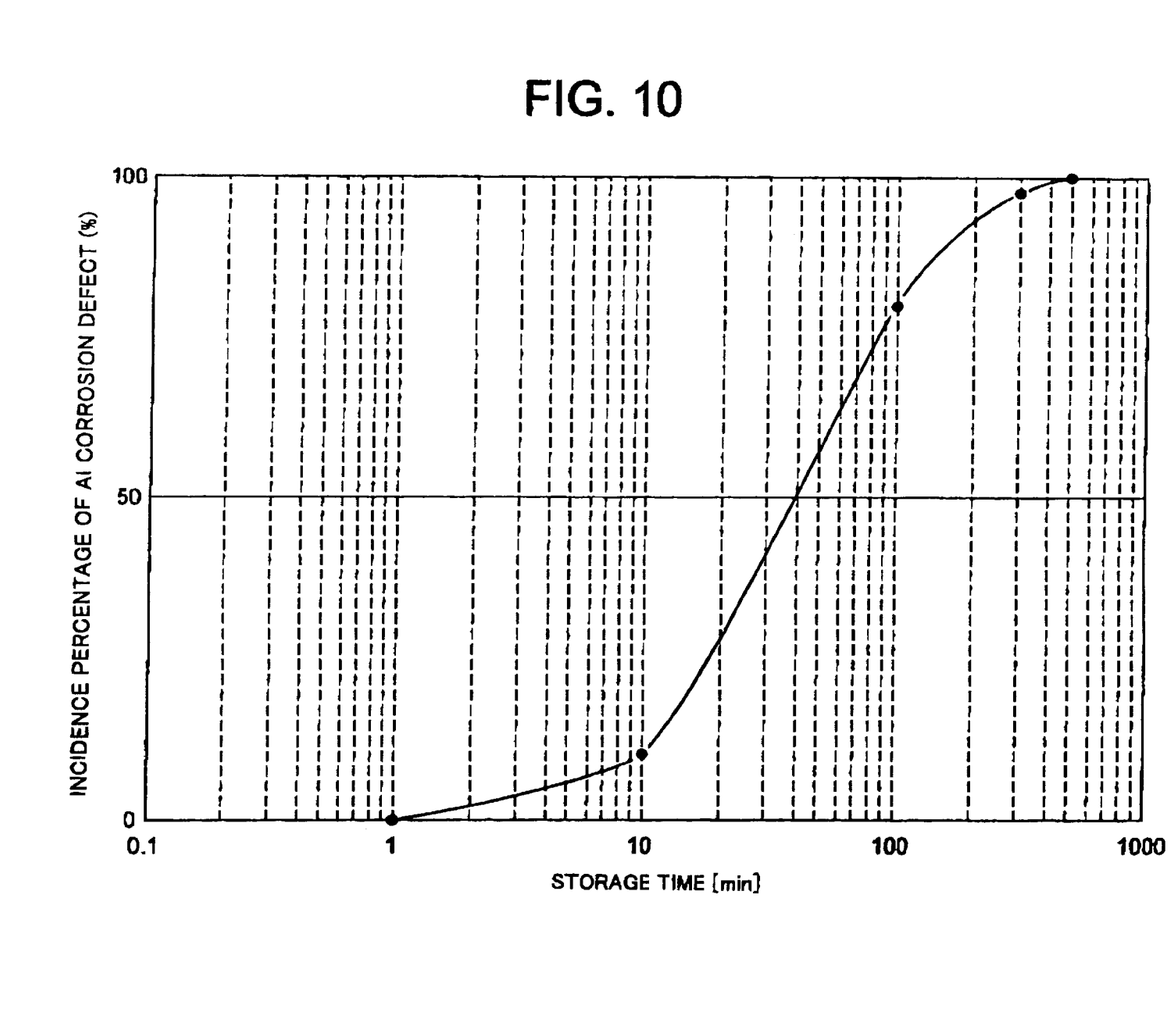
FIG. 10 is a diagram showing the relationship between storage time and corrosion rate of aluminum wiring in an existing box for accommodating the substrates.
Figure 11:
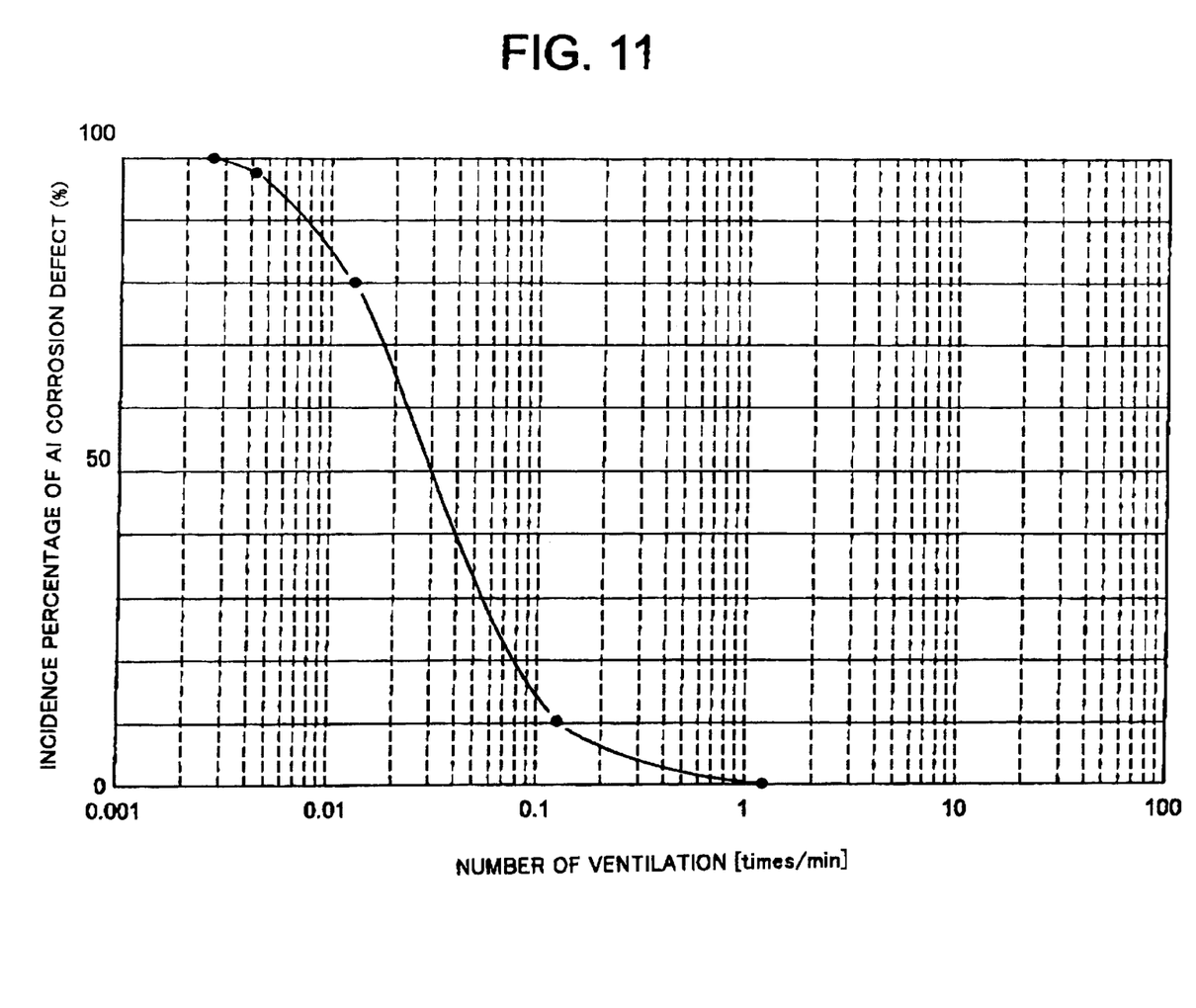
FIG. 11 is a diagram showing the relationship between number of ventilation and corrosion rates of aluminum wiring in the present box for accommodating the substrate.
Figure 12:
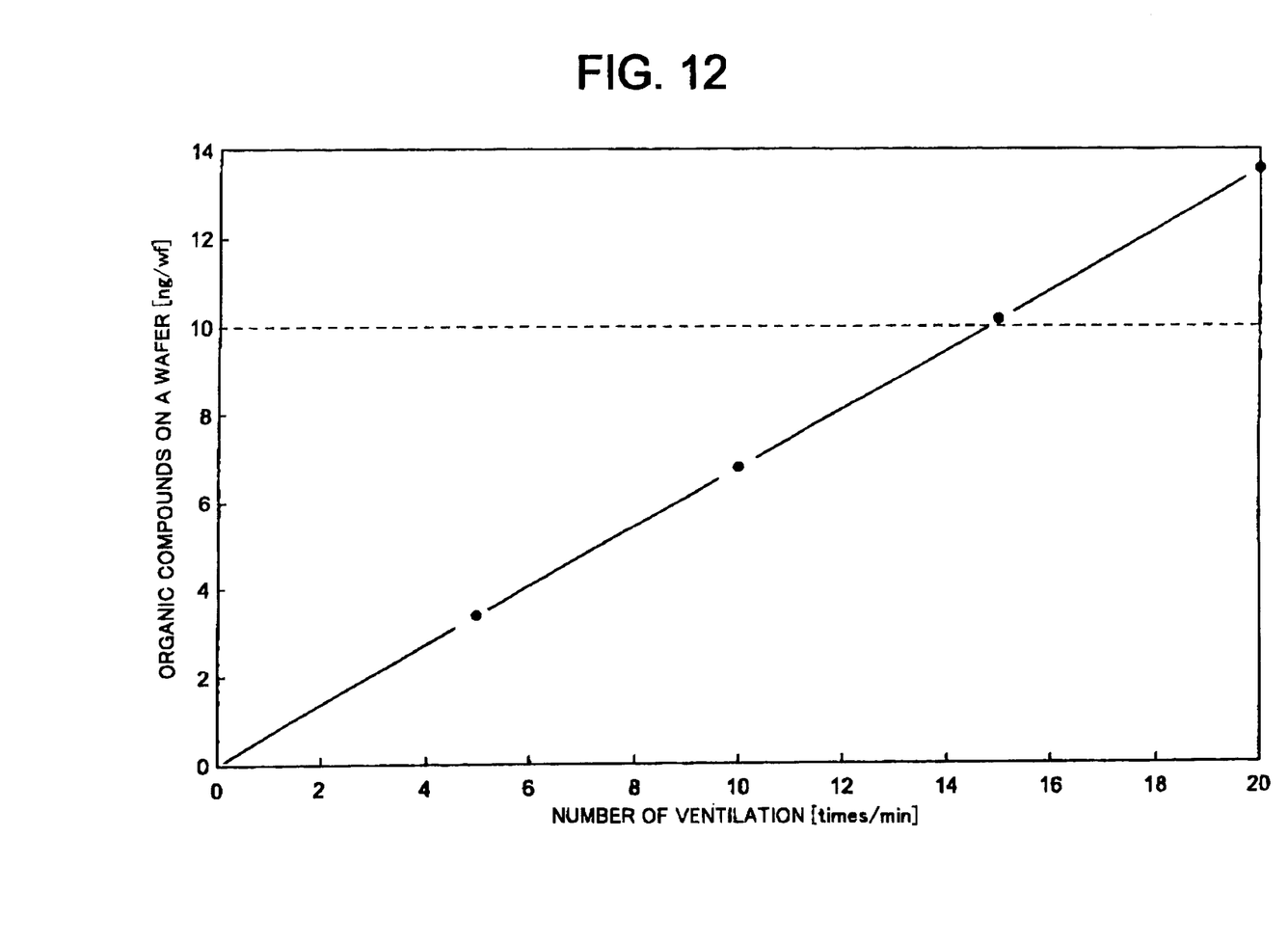
FIG. 12 is a diagram showing the relationship between amount of organic substance adhered to surfaces of a wafer after storing the wafer for a week and number of ventilation.

With reference to FIGS. 10 to 12, the number of ventilation provided in the present invention will be explained.

FIG. 10 is a diagram showing the relationship between the storage time in the existing box and rate of corrosion of aluminum wiring. According to the diagram, when the storage time exceeds approximately 10 min, the corrosion of the aluminum wiring proceeds rapidly.

FIG. 11 is a diagram showing the relationship between the number of ventilation in the substrate accommodating box and the rate of corrosion of the aluminum wiring. According to FIG. 11, when the number of ventilation is more than two times per minute, the corrosion rate (%) of the aluminum wiring becomes 0%. According to the box disclosed in Japanese Patent Laid-open Publication (KOKAI) No. HEI 8-148551, the flow rate being 1 1/min, when the volume is 23 litters, the number of ventilation is 0.04 times per minute, the corrosion rate being approximately 40%. When the volume is 8 litters, the number of ventilation is 0.1 times per minute, the corrosion rate being approximately 10%. The number of ventilation of more than two times per minute such as in the present invention can completely prevent the corrosion of aluminum from occurring.

FIG. 12 is a diagram showing the relationship between amount of organic compounds adsorbed on the wafer surface when the wafer is stored for a week and number of ventilation. The relationship is obtained under the following assumptions. When 24 wafers are stored in the box of the volume of 23 litters, organic compounds that are impurities in the air can be trapped down to 0.01 ppb (due to the out gas from the box material or the like, the organic compounds can not be completely trapped). Probability of adhesion of the organic compounds to the wafer is assumed to be 1/150. The amount of adhesion of the organic compounds varies due to the air flow rate (number of ventilation). A permissible amount of adhesion of the organic compounds is 10 ng/wf. From FIG. 12, taking the fluctuation into consideration, the number of ventilation is preferable to be less than 10 times per minute, more preferable to be less than 5 times per minute.

As explained in the above, when the box for accommodating substrates of the present invention is used, between steps where high cleanliness is required, while locally and efficiently maintaining the inside of the box in a highly clean atmosphere by use of an arbitrary gaseous impurity-trapping filter for the arbitrary gaseous-impurity and by use of circulation of the air in the box, the substrates to be treated such as semiconductor wafers can be transferred and stored. Further, even if the waiting time to the next step in the actual manufacturing line is prolonged due to troubles or maintenance of the machine, the substrates can be stored in the clean atmosphere for a long time. Accordingly, without being subjected to an influence of the storage time, a stable process characteristics can be obtained and the productivity can be improved, resulting in being effective as a transferring system of the manufacturing line. When the fan is intermittently operated, unevenness of the impurity concentration in the box is leveled to enable for the air to be replaced efficiently in a short time. Thereby, power is consumed more efficiently, the power supply being made the minimum requirement.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

What is claimed is:

1. A method of maintaining cleanliness of a substrate comprising:
   a first step of accommodating at least one substrate with a gaseous impurity-trapping filter disposed close thereto in a hermetically sealed box; and
   a second step of circulating an atmosphere in the box at a rate of two times or more per minute by use of an atmosphere circulating apparatus and interrupting the atmosphere circulating apparatus at a rate of once or more per several seconds to several minutes to diffuse the atmosphere, and causing the gaseous impurity-trapping filter to adsorb impurity in the atmosphere.

2. The method of maintaining cleanliness of a substrate as set forth in claim 1, wherein the atmosphere circulating apparatus is interrupted at a rate of once or more per minute to diffuse the atmosphere.

3. The method of maintaining cleanliness of a substrate as set forth in claim 1, wherein in the second step the atmosphere in the box is circulated at a rate of two to five times per minute.

4. The method of maintaining cleanliness of a substrate as set forth in claim 1, wherein in the box a particle trapping filter is further disposed in close vicinity of the substrate.

5. The method of maintaining cleanliness of a substrate as set forth in claim 1, wherein the substrate is a semiconductor substrate or a glass substrate for mask process.

6. The method of maintaining cleanliness of a substrate as set forth in claim 1, further comprising a third step of transferring the box to a prescribed place while maintaining cleanliness of the atmosphere in the box.

7. A box for accommodating a substrate, comprising:
   a housing in which space for accommodating the substrate is hermetically closed with a lid;
   a gaseous impurity-trapping filter disposed in the housing and adsorbing impurity contained in the atmosphere of the space; and
   an atmosphere circulating apparatus that circulates the atmosphere so that the atmosphere goes through the gaseous impurity-trapping filter at a rate of two times or more per minute and interrupts at a rate of once or more per several seconds to several minutes to diffuse the atmosphere.

8. The box for accommodating a substrate as set forth in claim 7, wherein the atmosphere circulating apparatus in one that circulates the atmosphere so as to go through the gaseous impurity-trapping filter at a rate of two times or more per minute and interrupts at a rate of once or more per minute to diffuse the atmosphere.

9. The box for accommodating a substrate as set forth in claim 7, wherein the gaseous impurity-trapping filter is formed in a pleat shape.

10. The box for accommodating a substrate as set forth in claim 7, wherein the gaseous impurity-trapping filter is formed in a honeycomb shape.

11. The box for accommodating a substrate as set forth in claim 7, wherein the gaseous impurity-trapping filter is formed in sponge shape.

12. The box for accommodating a substrate as set forth in claim 7, wherein the gaseous impurity-trapping filter is formed in particles.

13. The box for accommodating a substrate as set forth in claim 7, further comprising a portable power supply.

14. The box for accommodating a substrate as set forth in claim 13, wherein the portable power supply is attached on the outside of the housing.

15. The box for accommodating a substrate as set forth in claim 7, further comprising a particles trapping filter between the gaseous impurity-trapping filter and the substrate.

16. The box for accommodating a substrate as set forth in claim 7, wherein the substrate is a semiconductor substrate or a glass substrate for mask process.

* * * * *